(12) United States Patent
Hassan et al.

(10) Patent No.: US 8,743,507 B1
(45) Date of Patent: Jun. 3, 2014

(54) SEED TRILAYER FOR MAGNETIC ELEMENT

(71) Applicant: Seagate Technology LLC, Cupertino, CA (US)

(72) Inventors: Sameh Sayed Ali Hassan, Londonderry (GB); Gabriel G. McCafferty, Londonderry (IE); Yuqing Du, Londonderry (IE); Marcus Ormston, Derry (GB)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/797,500

(22) Filed: Mar. 12, 2013

(51) Int. Cl.
G11B 5/39 (2006.01)

(52) U.S. Cl.
USPC .................................................. 360/125.3

(58) Field of Classification Search
USPC .................................................. 360/125.3
See application file for complete search history.

(56) References Cited

U.S. PATENT DOCUMENTS

| | | | | |
|---|---|---|---|---|
| 6,411,476 B1 * | 6/2002 | Lin et al. | | 360/324.11 |
| 6,538,859 B1 * | 3/2003 | Gill | | 360/324.12 |
| 6,600,638 B2 * | 7/2003 | Gill | | 360/324.11 |
| 6,775,111 B2 * | 8/2004 | Lin et al. | | 360/324.11 |
| 6,953,629 B2 | 10/2005 | Hintz et al. | | |
| 7,122,852 B2 | 10/2006 | Horng et al. | | |
| 7,217,577 B2 | 5/2007 | Horng et al. | | |
| 7,238,979 B2 | 7/2007 | Horng et al. | | |
| 7,428,129 B2 | 9/2008 | Pinarbasi | | |
| 7,502,209 B2 * | 3/2009 | Freitag et al. | | 360/324.12 |
| 7,611,912 B2 | 11/2009 | Hong et al. | | |
| 7,773,348 B2 | 8/2010 | Freitag et al. | | |
| 7,829,963 B2 * | 11/2010 | Wang et al. | | 257/421 |
| 8,184,411 B2 * | 5/2012 | Zhang et al. | | 360/324.2 |
| 8,300,356 B2 * | 10/2012 | Zhang et al. | | 360/119.03 |
| 8,305,711 B2 * | 11/2012 | Li et al. | | 360/125.31 |
| 8,385,025 B2 * | 2/2013 | Maat et al. | | 360/324.12 |

FOREIGN PATENT DOCUMENTS

WO 2012082998 A1 6/2012

* cited by examiner

Primary Examiner — Mark Blouin
(74) Attorney, Agent, or Firm — Hall Estill Attorneys at Law

(57) ABSTRACT

A magnetic element may generally be configured at least with a magnetic stack contacting a leading shield with a seed trilayer. The seed trilayer may have a magnetic layer formed of a metal material and disposed between first and second non-magnetic layers while at least one of the non-magnetic layers constructed of the metal material.

20 Claims, 4 Drawing Sheets

FIG. 1
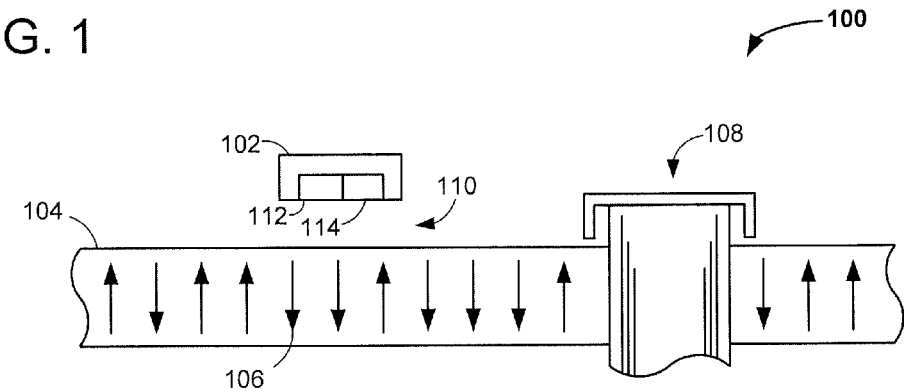
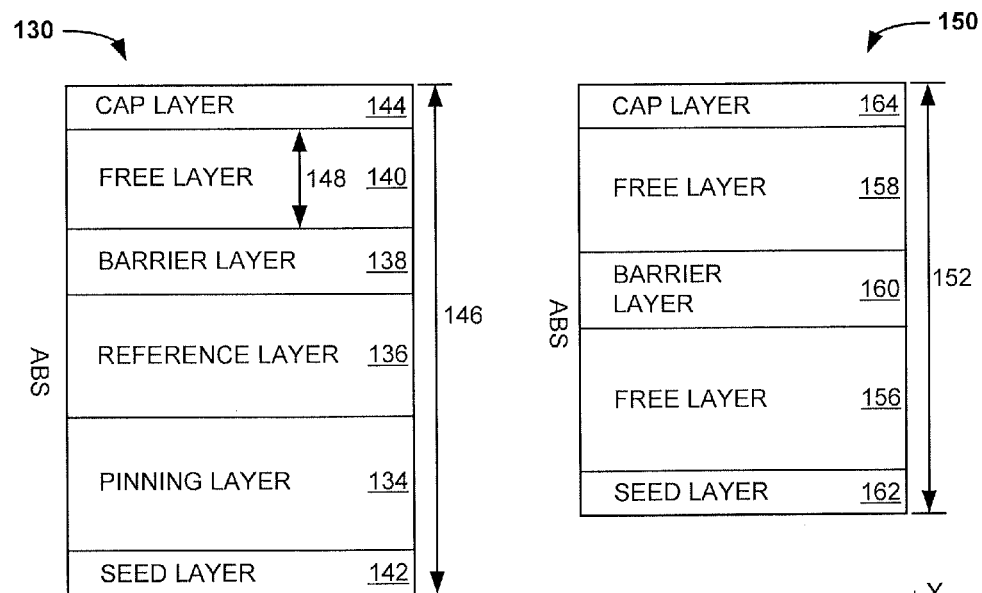
FIG. 2A
FIG. 2B
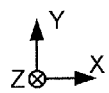

SEED TRILAYER FOR MAGNETIC ELEMENT

SUMMARY

Various embodiments are generally directed to a magnetic element capable of reading data bits in various data storage environments.

In accordance with various embodiments, a magnetic element may be configured at least with a magnetic stack contacting a leading shield with a seed trilayer. The seed trilayer may have a magnetic layer formed of a metal material and disposed between first and second non-magnetic layers with at least one of the non-magnetic layers constructed of the metal material.

BRIEF DESCRIPTION OF THE DRAWINGS

FIG. 1 is a block representation of an example portion of a data storage device configured and operated in accordance with some embodiments.

FIGS. 2A and 2B respectively show portions of example magnetic elements capable of being used in the data storage element of FIG. 1.

DETAILED DESCRIPTION

Figure 3:
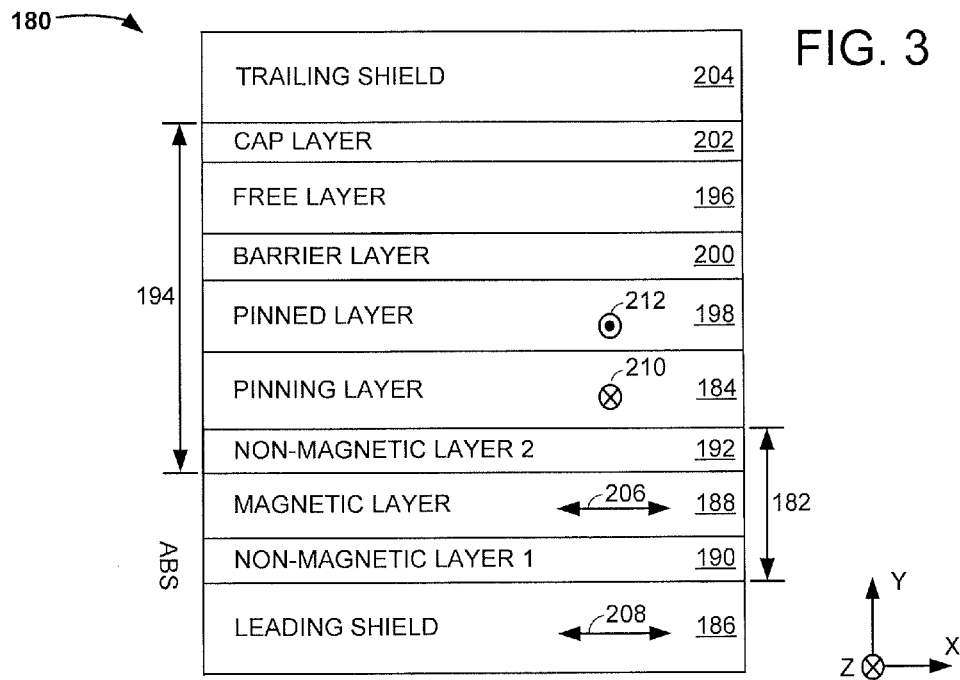
FIG. 3 displays a cross-sectional portion of an example magnetic element constructed in accordance with various embodiments.

A reduction in physical size combined with faster data transfer rates has been a continued goal for data storage devices. Such physical size minimization has increasingly become difficult with conventional data access components as magnetic components can experience degraded performance when scaled below various size thresholds. An increase in data bit density can further exacerbate the reduced physical size of data accessing components by shrinking the magnetic signature of each data bit among noise from adjacent data bits. Hence, the data storage industry has a focused interest in reducing the physical size of data accessing components while retaining operational speed and accuracy.

Consequently, a magnetic element may be constructed in accordance with various embodiments to have at least a magnetic stack contacting a leading shield with a seed trilayer that has a magnetic layer formed of a metal material and disposed between first and second non-magnetic layers while at least one of the non-magnetic layers is constructed of the metal material. The ability to tune the thickness and material of the seed trilayer can optimize the structure and operation of the magnetic stack. Such seed trilayer options may further allow the magnetic stack to be catered for operation in reduced form factor, increased data bit density storage devices.

While a tuned seed trilayer can be practiced in a variety of non-limiting environments, FIG. 1 displays a block representation of a portion of an example data storage device 100. Through controlled actuation, a transducing head 102 can be moved over a variety of locations on a magnetic storage media 104 where stored data bits 106 are positioned in predetermined patterns, such as radially concentric tracks or bit pattern media. Movement of the storage media 104 can be facilitated through attachment to one or more spindle motors 108 that rotate during use to produce an air bearing 110 on which the transducing head 102 flies.

The transducing head 104 can be configured with one or more transducing elements, such as a magnetic writer 112, magnetically responsive reader 114, and magnetic shields, which operate to program and read data from the selected data bits 106 of the storage media 108, respectively. In this way, controlled motion of the storage media 104 and transducing head 106 can align a data writer or reader with the data bits 106 defined on the storage media 104 to write, read, and rewrite data. As data bits 106 become more densely packed on the storage media 104, the transducing head 104 has less time to accurately sense individual data bits 106. Scaling the physical size of the magnetic stack portion of the transducing head 104 can increase data bit resolution, but may correspond with degraded performance.

FIGS. 2A and 2B respectively show example magnetic stacks 130 and 150 each capable of being used in the data storage device 100 of FIG. 1. It should be noted that the term "stack" is an unlimited term within this disclosure that can be one or more vertically and horizontally aligned layers, constructed of magnetic and non-magnetic material that are capable of magnetic reading and writing. Throughout the present application, the term "stack" will be understood to mean a component that is constructed to respond to external data bits. For example, but not in any way limiting, a magnetic stack may be a data reader that can differentiate between a plurality of data bits.

FIG. 2A illustrates an abutted junction magnetic stack 130 that has a fixed magnetization pinning layer 134 contacting a fixed magnetization reference layer 136 opposite a non-magnetic barrier layer 138 from a magnetically free layer 140. As the free layer 140 responds to an external data bit while the reference layer 136 maintains a fixed magnetization due to the exchange coupling with the pinning layer 134, an external data bit can be read as a logic state. Through various tuned configurations, seed 142 and cap 144 layers can be positioned on a single, or opposite sides of the stack 130 to provide fixed and/or free magnetizations.

Construction of the abutted junction magnetic stack 130 can have a shield-to-shield spacing 146 and free layer thickness 148 that determines the magnetic extent of the stack 130 and the possible data track resolution. However, the inclusion of the reference 136 and pinning 134 layers can correspond to a smaller free layer thickness 148, increased shield-to-shield spacing 146, and reduced magnetoresistive ratio between the free 140 and reference 136 layers. In contrast, the trilayer stack 150 of FIG. 2B may be used to read data bits with a reduced shield-to-shield spacing 152 and greater free layer thickness 154 compared to the abutted junction stack 130.

In operation, the trilayer stack 150 has first 156 and second 158 magnetically free layers that are separated by a barrier layer 160 and set to default magnetizations by biasing structures external to the trilayer stack 150. The relocation of any fixed magnetization structures from the stack 150 to elsewhere allow for the reduced physical size 152 compared to the fixed magnetization having abutted junction stack 130. However, the lack of any fixed magnetization in the trilayer stack 150 can be difficult to bias properly to read data at from densely packed data bits. As such, refinement of the abutted junction stack 130 to reduce shield-to-shield spacing 146 while increasing stack magnetic stability continues to be an industry goal.

While various aspects of the abutted junction stack 130, such as the barrier layer 138, may be reduced in size while maintaining predetermined operating conditions, the seed layer 142 can be tuned in some embodiments to increase stack 130 stability and allow thinner ferromagnetic thicknesses 148 to be utilized to reduce the shield-to-shield spacing 146. The seed layer 142 may further be tuned to promote the anisotropy, grain growth, and predetermined crystallographic direction of layers, such as pinning layer 134, subsequently grown atop the seed layer 142. Tuning the seed layer 142 to be magnetic can reduce coupling between the pinning 134 and seed 142 layers, but such seed layer magnetization can cause magnetic stiffness and partially misalign the magnetization of the seed layer 142, which may result in magnetic stack 130 instability.

With such magnetic stiffness and instability in mind, a seed lamination of magnetic and non-magnetic layers can provide additional tuning options to reduce magnetization misalignment while optimizing magnetic stack 130 performance. FIG. 3 generally illustrates a cross-sectional block representation of an example magnetic element 180 that is configured with a seed trilayer 182 disposed between a pinning layer 184 and a leading shield 186. The term "trilayer" is hereby meant as exclusively three contacting layers that have both magnetic and non-magnetic materials and characteristics.

As shown in FIG. 3, the seed trilayer 182 has a magnetic layer 188 disposed between first 190 and second 192 non-magnetic layers. The positioning of second non-magnetic layer 192 can decouple the magnetic 188 and first non-magnetic 190 layers from the pinning layer 184, which can increase the pinning strength and allow for a reduced thickness and shield-to-shield spacing 194. That is, the location, material, and thickness of the second non-magnetic layer 192 can reduce or eliminate the exchange coupling between the pinning layer 184 and the magnetic layer 188 to optimize the tunnel magnetoresistive ratio and resistance area between the free 196 and reference 198 layers across the barrier layer 200.

While the seed trilayer 182 configuration of magnetic 188 and non-magnetic 190 and 192 layers is positioned adjacent the leading shield 186, such orientation is not limiting as the cap layer 202 may be replaced by a trilayer structure between the free layer 196 and a trailing shield 204. Regardless of whether the seed trilayer 182 is positioned proximal the leading 186 or trailing 204 shield, or both, the construction of the magnetic layer 188 between non-magnetic layers 190 and 192 allows for tuned coupling with the shield 186 or 204 that effectively reduces the shield-to-shield spacing 194 and shrinks the magnetic size of the magnetic element 180 to correspond with increased data bit density data storage environments.

The decoupling of the pinning layer 184 from the magnetic layer 188 allows the magnetic layer 188 to have a magnetization 206 that responds to the leading shield 208 magnetization to more efficiently absorb stray magnetic flux as opposed to the leading shield 186 alone. In contrast, if the magnetic layer 188 was coupled to the pinning layer 184, the magnetic layer magnetization 206 would be pulled in orthogonally oriented directions by the leading shield magnetization 208 and the pinning layer magnetization 210, which can induce instability as the magnetic layer magnetization 206 inadvertently switches between magnetic domains. With the tuned configuration of the seed trilayer 182 to decouple the pinning 184 and magnetic 188 layers, the pinning layer magnetization 210 can remain uninterrupted in fixing the reference layer magnetization 212 in a predetermined magnetization direction, such as orthogonal to the leading shield magnetization 208.

Figure 4:
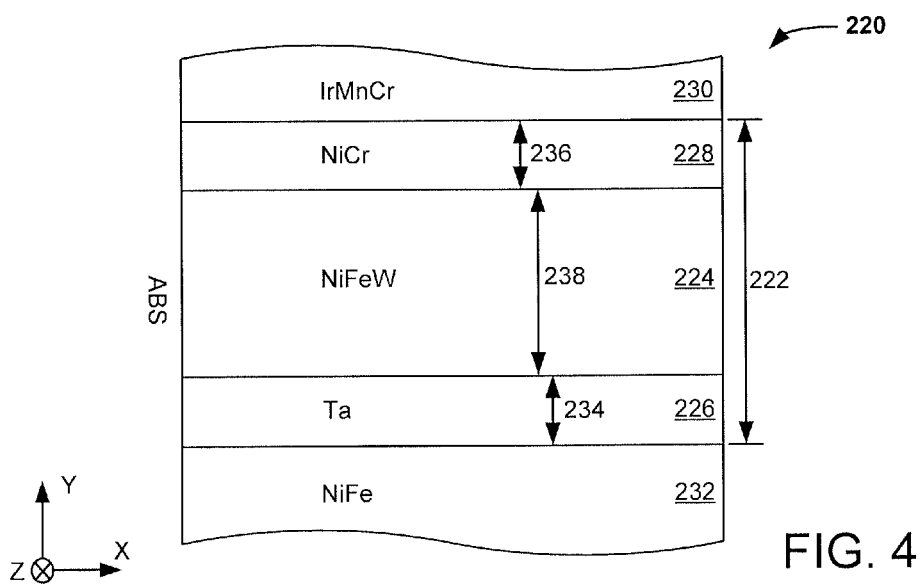
FIG. 4 shows a cross-sectional portion of an example magnetic element constructed in accordance with some embodiments.

FIG. 4 provides a cross-sectional block representation of a portion of an example magnetic element 220 configured with a seed trilayer 222 tuned for materials and thicknesses to enhance magnetic stability and magnetic sensing performance. The seed trilayer 222 has a magnetic layer 224 of NiFeW contactingly between non-magnetic layers 226 and 228 that are respectively constructed of Ta and NiCr. The selection of these materials is by no means exclusive, limiting, or required, but illustrates an embodiment that optimizes a IrMnCr antiferromagnetic pinning layer 230 while making a NiFe leading shield 232 more robust.

It should be noted that the first non-magnetic layer 226 may be formed of any number of transition metals such as Ruthenium and Platinum that can provide non-magnetic properties that buffer the leading shield 232 from the magnetic layer 224. The first non-magnetic layer 226 can be tuned for thickness 234 as well as material to provide a predetermined amount of coupling with the leading shield 232 that increases shielding for the magnetic element 220, but isn't too large to affect the magnetization of the pinning layer 230.

Similarly, the second non-magnetic layer 228 can be tuned to an unlimited variety of thicknesses 236 and materials to control the amount of coupling between the magnetic layer 224 and the pinning layer 230. Various embodiments use NiCr for the second non-magnetic layer 228 to decouple the pinning layer 230 from the magnetic layer 224 and provide optimized texture and anisotropy so that the pinning layer 230 is formed with a greater pinning force than if other non-magnetic materials were used. Such increased pinning layer 230 pinning force can correspond with a greater magnetoresistive ratio for the magnetic element 220 that is conducive to minimized data bit signatures in high data bit density environments.

The formation of the magnetic layer 224 as a NiFeW compound is not required or limiting, but can provide optimized decoupled performance when matched with the NiCr compound of the second non-magnetic layer 228. In some embodiments, the magnetic layer 224 and both non-magnetic layers 226 and 228 of the seed trilayer 222 and the leading shield 232 all have a common metal material, like Ni or Co. Other embodiments configure the non-magnetic layers 226 and 228 of the same metal compound. Regardless of the tuned material composition of the various seed trilayer 222, leading shield 232, and pinning layer 230 having at least the second non-magnetic layer 228 and magnetic layer 224 with a common metal element in their respective compounds can allow for predetermined crystallographic growth of the pinning layer 230 that corresponds with optimized performance.

Tuning the second non-magnetic layer 228 with a NiCr composition may further optimize pinning layer 230 operation by decreasing the first non-magnetic layer thickness 234. In other words, construction of the second non-magnetic layer 228 as NiCr can provide greater pinning strength for the pinning layer 230, which allows the first non-magnetic layer 226 to be thinner to provide greater coupling between and magnetic shielding with the leading shield 232 and magnetic layer 224. However, tuning the thicknesses of the non-magnetic layers 234 and 236 as well as the magnetic layer thickness 238 can result in a variety of different configurations that each provide altered magnetic element 220 performance that may be optimal for various data storage environments, such as with the use of side shields in high data bit density devices.

Figure 5:
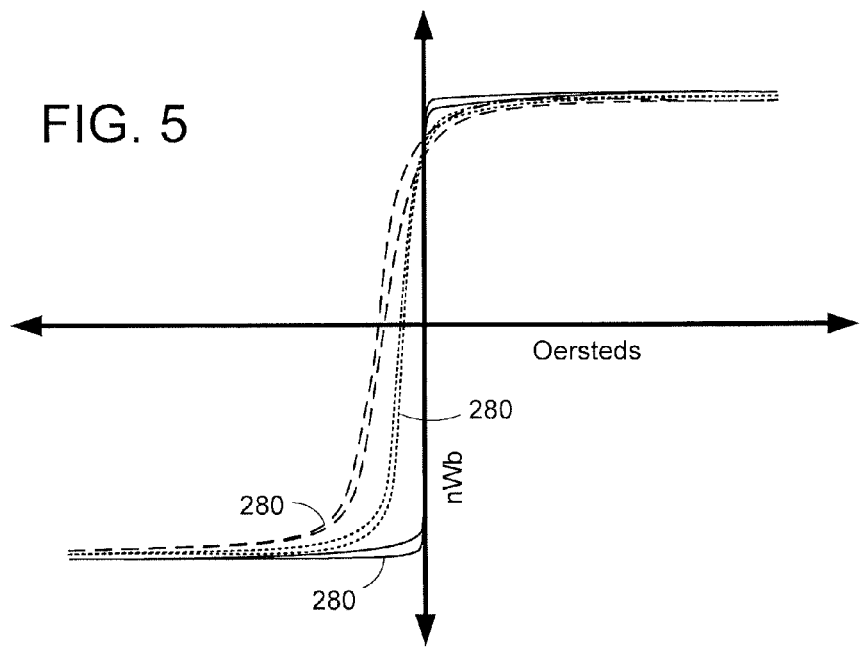
FIG. 5 graphs operational data from a variety of example magnetic elements constructed an operated in accordance with various embodiments.
Figure 6:
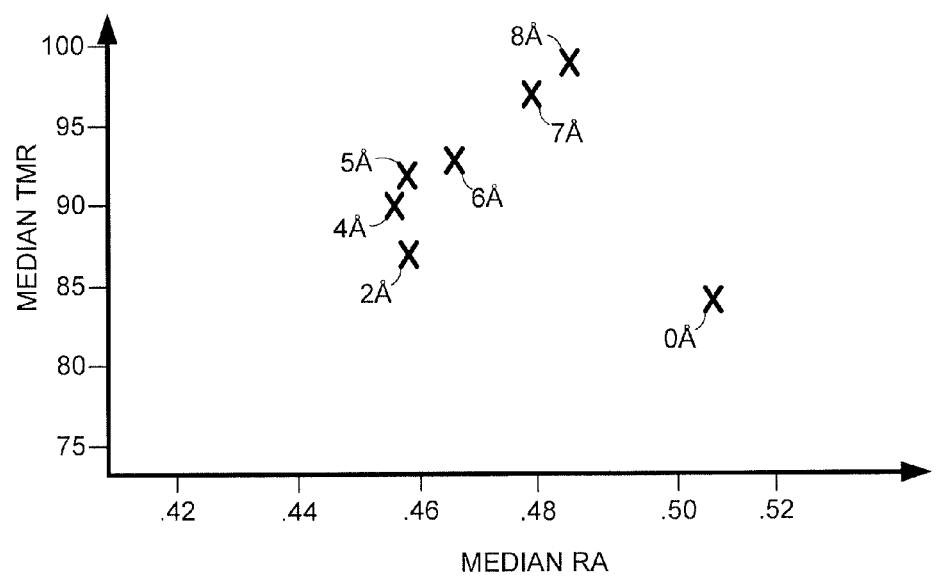
FIG. 6 plots operational data from various example magnetic element operated in accordance with some embodiments.

FIG. 5 graphs hysteresis loops for a variety of differently tuned example magnetic elements. Specifically, the thickness of the NiCr second non-magnetic layer of a seed trilayer is tuned to different continuously uniform thicknesses. Solid loop 250 corresponds to approximately a 12 Å layer thickness and shows how the magnetoresistive ratio and resistance area of the magnetic element is enhanced due at least to the decoupling of the magnetic portions of the seed trilayer from the pinning layer. Segmented loops 252 and 254 that respectively correspond with 4 Å and 2 Å NiCr thicknesses reinforce how the magnetic performance of a magnetic element can be controlled simply by adjusting the thickness FIG. 6 plots how tuning the thickness of the first non-magnetic layer of a seed trilayer can provide different magnetic element operating characteristics, namely the median tunnel magnetoresistive ratio (TMR) and the resistance area (RA). The various balances of resistance area and TMR shown by points associated with Ta thicknesses of 2 Å, 4 Å, 5 Å, 6 Å, 7 Å, 8 Å compare to baseline point of 0 Å to illustrate the variety of performance characteristics capable by tuning the first non-magnetic layer. For example, a 6 Å amorphous layer of Ta can provide a reduced resistance area and elevated TMR while allowing the magnetic layer to couple to the leading shield with a predetermined strength.

Figure 7:
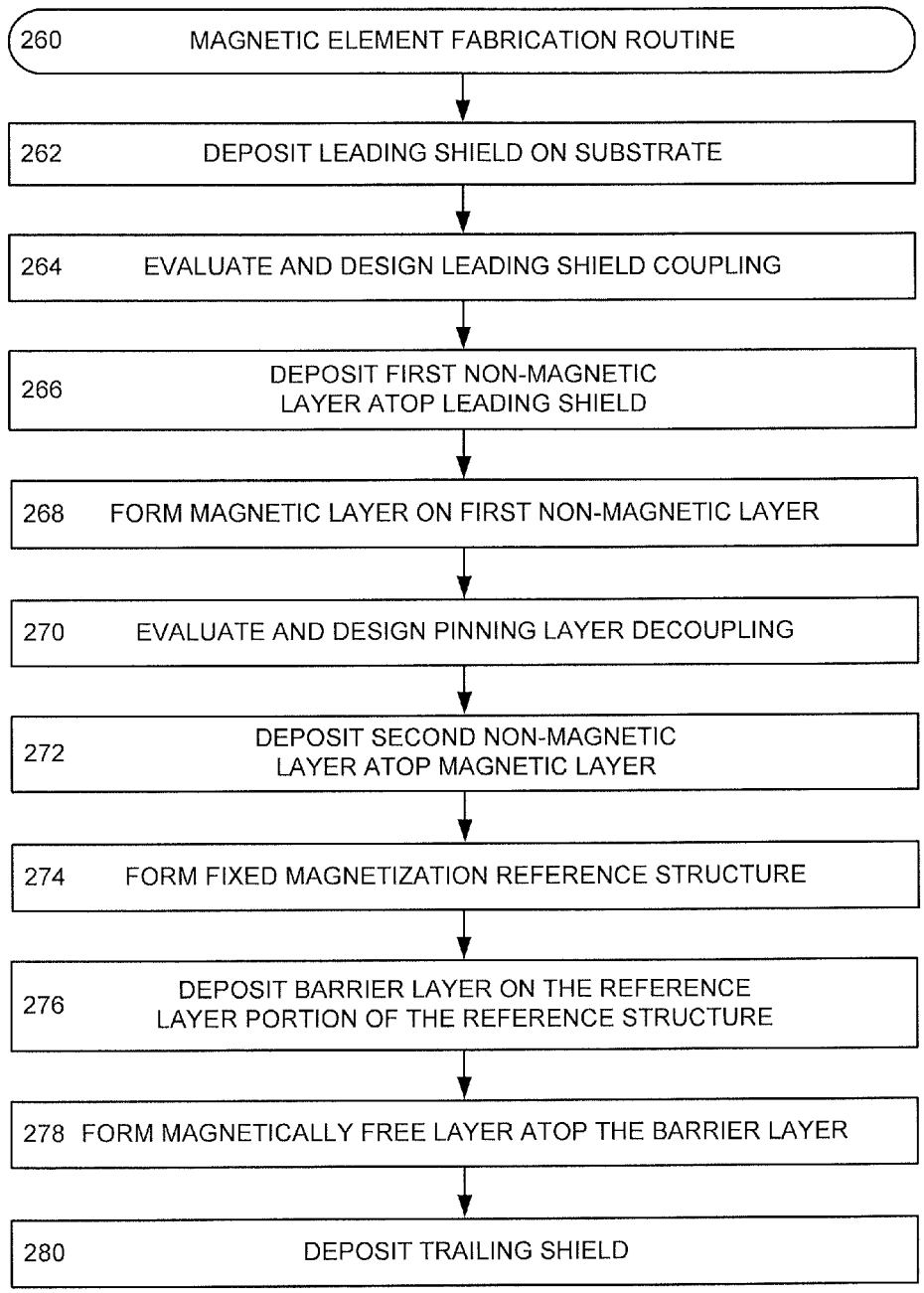
FIG. 7 provides a flowchart of an exemplary magnetic element fabrication routine carried out in accordance with various embodiments.

The ability to tune the various layers of a seed trilayer can provide a host of magnetic element performance controls. Such tuning can occur at any time and may adhere to a predetermined fabrication routine, such as the example magnetic element fabrication routine 260 of FIG. 7. Initially, the routine 260 can deposit a leading shield onto a substrate in step 262. Such leading shield, and any other layer, may be formed with any type of deposition process, such as atomic layer deposition and oblique incidence angle sputtering, to construct a continuous uniform layer of predetermined material.

Construction of the leading shield can be concurrently of sequentially conducted with step 264 where the strength of coupling between the leading shield and the yet to be formed magnetic layer of the seed trilayer is to be determined by choosing the material and thickness of the first non-magnetic layer. The designed coupling is then constructed through deposition of the first non-magnetic layer in step 266 and the magnetic layer in step 268. As a non-limiting example, the first non-magnetic layer is formed of Tantalum and has a 6 thickness and the magnetic layer comprises NiFeW and has a 12 thickness.

Step 270 follows the formation of the magnetic layer and determines the material and thickness of the second non-magnetic layer and may consider the operational data from FIG. 5. The routine 260 proceeds to form the non-magnetic layer atop the magnetic layer in step 272 with a predetermined material, such as NiCr, and thickness, such as 8. With the seed trilayer formed, steps 274, 276, and 278 respectively construct the fixed magnetization reference structure, barrier layer, and magnetically free layer, which complete the magnetic stack with or without the deposition of a cap layer.

The formation if a trailing shield in step 280 finalizes the construction of the magnetic element and routine 260. Through the various steps and decisions of routine 260, a magnetic element can be created with an optimized seed structure that is tuned to concurrently provide magnetic and non-magnetic layers of predetermined material and thicknesses. However, routine 260 is not limited to the steps and decisions provided in FIG. 7 as an unlimited variety of steps and processes may be changed, omitted, and added, at will. For instance, additional steps could evaluate and decide the texture and anisotropy of the second non-magnetic layer to provide a predetermined pinning strength for the pinning layer.

The variety of seed trilayer tuning options provided through construction of magnetic and non-magnetic layers allows for a wide range of magnetic performance characteristics. The ability to tune the material of the magnetic and non-magnetic layers to have a common metal material allows the anisotropy and grain growth for the adjacent pinning layer to be optimized. Moreover, the tuning of the thicknesses of the seed trilayer layers provided diverse coupling and decoupling parameters that correspond with decreased shield-to-shield spacing and heightened magnetic stability. It should be noted that while various embodiments have been directed to magnetic sensing, it will be appreciated that the claimed invention can readily be utilized in any number of other applications, including data storage device applications.

It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed. For example, the particular elements may vary depending on the particular application without departing from the spirit and scope of the present disclosure.

What is claimed is:

1. A magnetic element comprising a magnetic stack contacting a leading shield with a seed trilayer, the seed trilayer comprising a magnetic layer formed of an alloy of first, second, and third metal materials, the magnetic layer disposed between first and second non-magnetic layers, at least one of the non-magnetic layers constructed of the metal material.

2. The magnetic element of claim 1, wherein the magnetic stack comprises an abutted junction lamination with a fixed magnetization providing pinning layer.

3. The magnetic element of claim 1, wherein the magnetic stack comprises a trilayer lamination without a fixed magnetization providing layer.

4. The magnetic element of claim 1, wherein the first metal material comprises Nickel.

5. The magnetic element of claim 1, wherein the seed trilayer is exclusively three layers of different materials.

6. The magnetic element of claim 1, wherein the first non-magnetic layer comprises a single element and the second non-magnetic layer comprises a binary compound.

7. The magnetic element of claim 6, wherein the single element is Tantalum and the binary compound is NiCr.

8. The magnetic element of claim 1, wherein the magnetic layer comprises NiFeW.

9. The magnetic element of claim 1, wherein the leading shield comprises the metal material in a binary compound.

10. The magnetic element of claim 9, wherein the binary compound is NiFe.

11. The magnetic element of claim 1, wherein a pinning layer of the magnetic stack contacts the seed trilayer opposite the leading shield, the pinning layer comprises an antiferromagnetic material.

12. The magnetic element of claim 1, wherein the non-magnetic layers have dissimilar thicknesses.

13. An apparatus comprising:
a magnetic stack;
a leading shield; and
a seed trilayer contacting both the magnetic stack and leading shield, the seed trilayer comprising a magnetic layer formed of an alloy of first, second, and third metal materials, the magnetic layer disposed between first and second non-magnetic layers, the first non-magnetic layer comprising a compound of the first metal material and a third metal material, the second non-magnetic layer constructed metal material.

14. The apparatus of claim 13, wherein the first non-magnetic layer couples the magnetic layer to the leading shield.

15. The apparatus of claim 13, wherein the second non-magnetic layer decouples a pinning layer of the magnetic stack from the magnetic layer.

16. The apparatus of claim 13, wherein the first and second non-magnetic layers are dissimilar materials and thicknesses.

17. The apparatus of claim 13, wherein the magnetic, first non-magnetic, and second non-magnetic layers are dissimilar materials and thicknesses.

18. A data transducer comprising a seed trilayer disposed between a pinning layer of a magnetic stack and a leading shield, the seed trilayer comprising a magnetic layer formed of a first compound with first, second, and third metal materials, the magnetic layer disposed between first and second non-magnetic layers, at least one of the non-magnetic layers constructed of a second compound with the first metal material and a fourth metal material.

19. The data transducer of claim 18, wherein the first metal material comprises Nickel, the second metal material comprises Iron, and the third metal material comprises Tungsten, and the fourth metal material comprises Chromium.

20. The data transducer of claim 18, wherein only the second non-magnetic layer comprises the first and fourth metal materials.

* * * * *